United States Patent
Tamatani (10) Patent No.: US 8,291,129 B2
(45) Date of Patent: Oct. 16, 2012

(54) DATA PROCESSING DEVICE

(75) Inventor: Mitsuyuki Tamatani, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 34 days.

(21) Appl. No.: 12/878,464

(22) Filed: Sep. 9, 2010

(65) Prior Publication Data

US 2011/0179265 A1 Jul. 21, 2011

(30) Foreign Application Priority Data

Jan. 21, 2010 (JP) ................................ 2010-011293

(51) Int. Cl.
*G06F 3/00* (2006.01)
*G06F 13/00* (2006.01)

(52) U.S. Cl. .................... 710/14; 710/5; 710/8; 710/15; 710/33; 710/36

(58) Field of Classification Search ........................ None
See application file for complete search history.

(56) References Cited

U.S. PATENT DOCUMENTS

| | | |
|---|---|---|
| 2001/0022664 A1 | 9/2001 | Tsuchiya |
| 2002/0041706 A1 | 4/2002 | Nakase |
| 2005/0110518 A1 | 5/2005 | Kanno et al. |
| 2009/0300262 A1* | 12/2009 | Vorbach ............................ 711/5 |

FOREIGN PATENT DOCUMENTS

| | | |
|---|---|---|
| JP | A-2001-245162 | 9/2001 |
| JP | A-2002-077657 | 3/2002 |
| JP | A-2004-200311 | 7/2004 |
| JP | A-2005-039316 | 2/2005 |
| JP | A-2005-124130 | 5/2005 |
| JP | A-2009-003765 | 1/2009 |

* cited by examiner

*Primary Examiner* — Scott Sun (74) *Attorney, Agent, or Firm* — Oliff & Berridge, PLC

(57) ABSTRACT

It is assumed that the image data inputted are subjected to run-length compression and compressed encoding based on Huffman encoding. The first step configuration configured on a reconfigurable circuit includes run-length compression circuits 102a and 102b of two ways for parallel processing and FIFOs 108a and 108b which hold the output data from the circuits, respectively. For example, the data of odd pages are supplied to the run-length compression circuit 102a and the data of even pages are supplied to the run-length compression circuit 102b. After the compression processing proceeds, when at least one of the FIFOs 108a and 108b becomes full, the reconfigurable circuit is reconfigured into the second step configuration. In this configuration, the FIFOs 108a and 108b holding the compression results are left and two Huffman encoding circuits for encoding the data supplied from these FIFOs are included.

7 Claims, 10 Drawing Sheets

DATA PROCESSING DEVICE

CROSS-REFERENCE TO RELATED APPLICATIONS

This application is based on and claims priority under 35 USC 119 from Japanese Patent Application No. 2010-011293 filed on Jan. 21, 2010.

BACKGROUND

Technical Field

This invention relates to a data processing device.

SUMMARY

According to an aspect of the invention, a data processing device includes a reconfigurable circuit and a control unit. The reconfigurable circuit is capable of being dynamically reconfigured in circuit configuration. And, the control unit controls the reconfigurable circuit. The control unit repeatedly executes: a first reconfiguration control of reconfiguring, on the reconfigurable circuit, a plurality of first processing circuits and a plurality of first holding circuits corresponding to the plurality of first processing circuits, respectively; a first processing control of repeating processing of inputting mutually different input data to the respective plurality of first processing circuits reconfigured on the reconfigurable circuit by the first reconfiguration control so that the data inputted are processed in parallel therein and of inputting processing result data outputted from the plurality of first processing circuits, respectively to the corresponding first holding circuits so that the data inputted are held therein, until a quantity of the processing result data inputted to any one of the plurality of first holding circuits reaches an upper limit of the pertinent first holding circuit; a second reconfiguration control of reconfiguring a plurality of second processing circuits on the reconfigurable circuit in place of the plurality of first processing circuits while leaving the plurality of first holding circuits even after the first processing control; and a second processing control of inputting, to the respective second processing circuits reconfigured on the reconfigurable circuit by the second reconfiguration control, processing result data held in the corresponding first holding circuits so that the data inputted are processed in parallel therein and if all the processing result data held in the plurality of first holding circuits have been processed by the plurality of second processing circuits, returning to the first reconfiguration control again.

BRIEF DESCRIPTION OF THE DRAWINGS

Exemplary embodiment(s) of the present invention will be described in detail based on the following figures, wherein.

DETAILED DESCRIPTION

Figure 1:
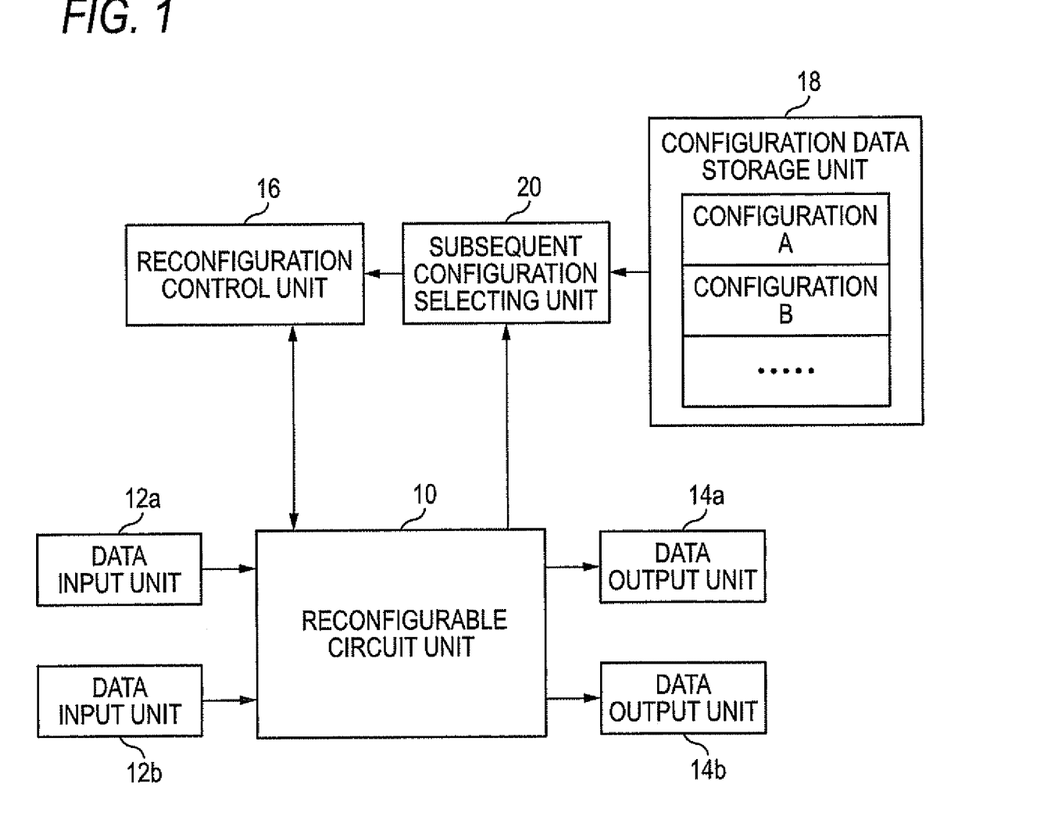
FIG. 1 is a view showing an example of a data processing device according to an exemplary embodiment of this invention.

A data processing device typically shown in FIG. 1 includes a reconfigurable circuit unit 10; two ways of data input units 12a and 12b; two ways of data output unit 14a and 14b; a reconfiguration control unit 16; a configuration data storage unit 18; and a subsequent selecting unit 20. Among these components, the reconfigurable circuit unit 10 is a circuit consisting of a group of circuit elements capable of dynamically rearranging the connection configuration, but the other components are components provided in a functional point of view. From the viewpoint of hardware, the data processing device, in addition to the above reconfigurable circuit unit 10, includes for example a general-purpose processor for executing the control such as reconfiguration of the reconfigurable circuit unit 10, a memory such as a RAM (random access memory) and an input/output circuit which executes input/output of data for an external device. It is needless to say that some of these hardware components may be integrated on a single integrated circuit.

The reconfigurable circuit unit 10 is a circuit capable of reconfiguring dynamically (i.e. while the pertinent processor operates) an internal logic circuit configuration. The reconfigurable circuit unit 10 may be various known circuits such as DNA (Digital Network Architecture) disclosed in JP-A-2009-3765 or circuits which will be developed in the future. For example, DNA is an array composed of a large number of circuit elements (PE: processor elements); the connection configuration among these circuit elements can be rearranged at a high speed (e.g. for one clock). Incidentally, where a DAPDNA architecture introduced by this reference is adopted in this exemplary embodiment, the reconfiguration control unit 16 and subsequent configuration selecting unit 20 are realized by executing the program representative of each of the functions described later using a general-purpose processor core named as DAP (Digital Application Processor). In this case, the reconfigurable circuit unit 10 and general-purpose processor core are provided as a single dynamic reconfigurable processor (DRP: Dynamic Reconfigurable Processor). It is needless to say that this is only an example, and other reconfigurable processor architecture may be adopted.

The data input units 12a and 12b supply input data to processing circuits reconfigured on the reconfigurable circuit unit 10. For example, buffer regions for input data secured on the memory connected to the reconfigurable circuit unit 10 are an example of the data input units 12a and 12b. In this case, where a host system (e.g. CPU of a computer where this data processing device is mounted) causes the data processing device according to this exemplary embodiment to execute data processing, it transfers the input data to be processed to each of the buffer regions and instructs the reconfiguration control unit 16 to process the input data. In response to this instruction, the reconfiguration control unit 16 causes the data input units 12*a* and 12*b* to supply the input data to each of the processing circuits configured on the reconfigurable circuit unit 10. As another example, from the host system to the data processing device according to this exemplary embodiment, the data may be transferred through DMA (direct memory access); in this case, the data input units 12*a* and 12*b* correspond to e.g. channels allotted by a DMA controller (not shown) within the data processing device.

The data output units 14*a* and 14*b* output, to the host system, the data outputted from the processing circuits reconfigured on the reconfigurable circuit unit 10. Like the data input units 12*a* and 12*b* described above, concrete examples of the data output units 14*a* and 14*b* are output buffers secured on the memory connected to the reconfigurable circuit unit 10 or output channels allotted from the DMA controller.

As described above, in this exemplary embodiment, two ways of the data input units (12*a*, 12*b*) and data output units (14*a*, 14*b*) are provided, respectively. This corresponds to executing parallel processing for the two ways of circuits of the same kind configured on the reconfigurable circuit unit 10 (the detail thereof will be explained later).

The reconfiguration control unit 16 reconfigures the circuits for data processing on the reconfigurable circuit unit 10 by controlling the connection relationship among the circuit elements within the reconfigurable circuit unit 10. Further, on the basis of an instruction from the host system, the reconfiguration control unit 16 controls supply of the input data to the circuits reconfigured on the reconfigurable circuit unit 10 via the data input units 12*a* and 12*b* and return of the output data from the circuits to the host system via the data output units 14*a* and 14*b*.

Figure 2:
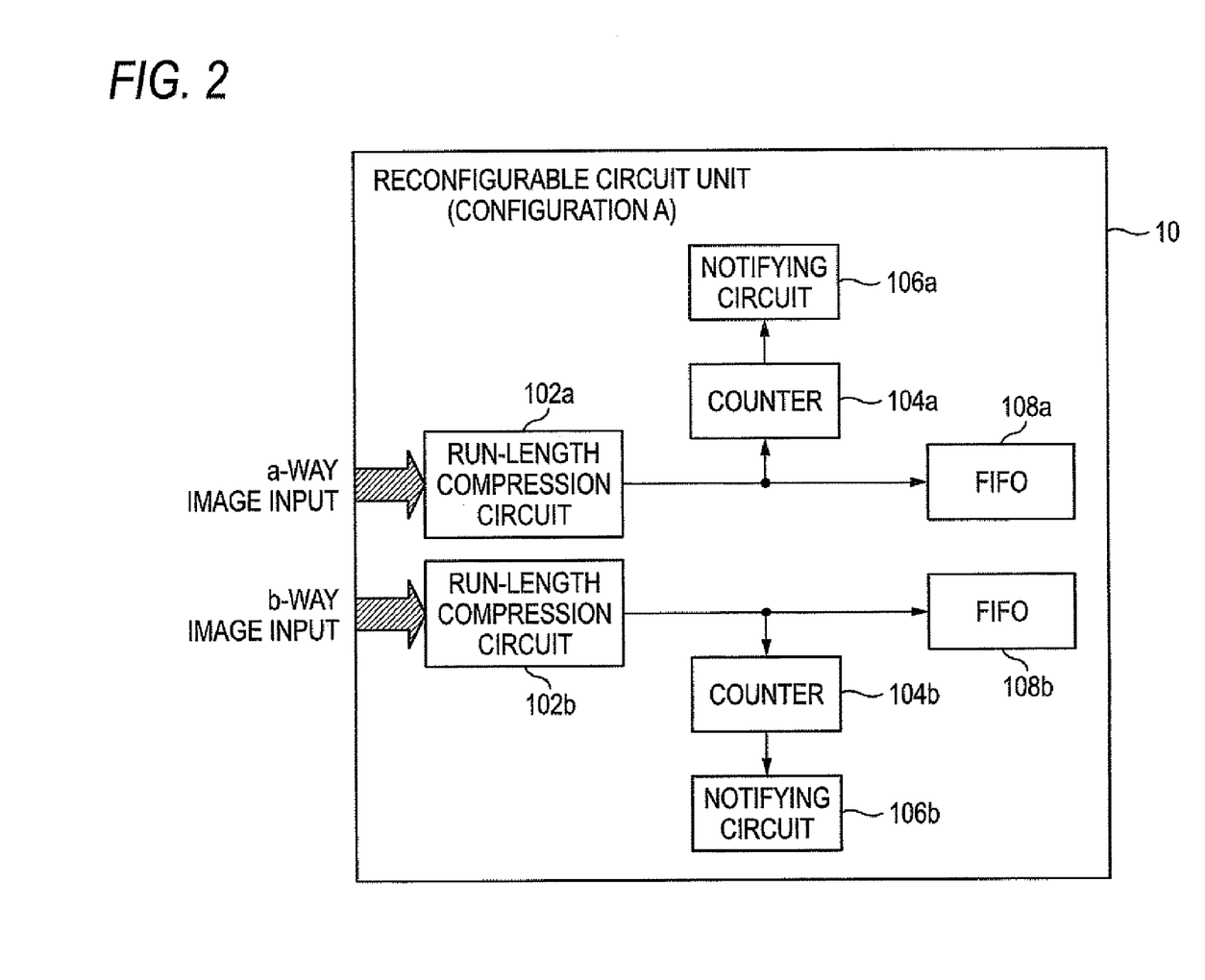
FIG. 2 is a view schematically showing a first configuration A which is configured on a reconfigurable circuit.
Figure 3:
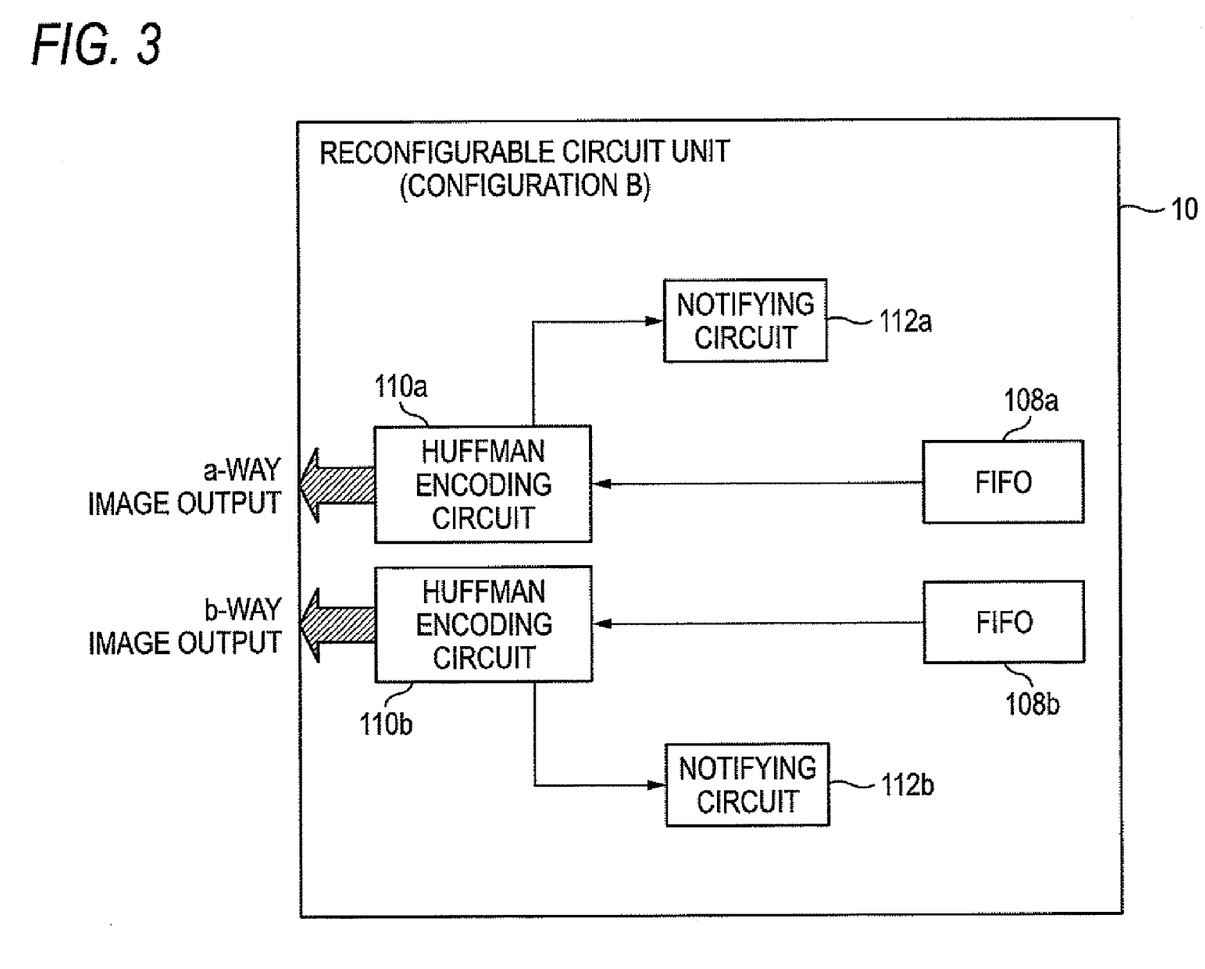
FIG. 3 is a view schematically showing a second configuration B which is configured on a reconfigurable circuit.

Reconfiguration of the circuits within the reconfigurable circuit unit 10 is done according to the configuration data stored in the configuration data storage unit 18. In this exemplary embodiment, the configuration data storage unit 18 stores configuration data A and B whose circuit configurations are schematically shown in FIGS. 2 and 3, respectively. The configuration data storage unit 18 is constructed, for example, on a storage device such as RAM or non-volatile memory within the data processing device. In the configuration data storage unit 18, on the basis of the control by the host system, new configuration data can be added and the existing data can be deleted.

The subsequent configuration selecting unit 20 selects the data of the circuit configuration to be subsequently reconfigured on the reconfigurable circuit unit 10. The control information on the order by which the group of configuration data stored in the configuration data storage unit 18 are to be applied to the reconfigurable circuit unit 10 is previously set in the subsequent configuration selecting unit 20 from the host system. On the basis of the control information, the subsequent configuration selecting unit 20 selects the configuration data representative of the circuit configuration to be subsequently configured on the reconfigurable circuit unit 10 and delivers the configuration data to the reconfiguration control unit 16. Upon completion of the processing in the circuit configuration configured at present on the reconfigurable circuit unit 10, the reconfiguration control unit 16 writes the configuration data instructed from the subsequent configuration selecting unit 20 into the reconfigurable circuit unit 10 thereby to change the reconfigurable circuit unit 10 into the subsequent circuit configuration.

Additionally, like the DAPDNA architecture described above, the circuit reconfiguration may be done by providing a configuration memory including a plurality of banks on the reconfigurable circuit unit 10, storing the configuration data in each of the banks and sequentially switching the bank to be used. For example, if the greater number of configuration data than that of the banks of the configuration memory are used, the configuration data in each bank may be sequentially rewritten by the configuration data within the configuration data storage unit 18.

As described above, in this exemplary embodiment, two ways of circuits of the same kind are configured on the reconfigurable circuit unit 10 for parallel processing. Typical examples of the circuit configuration to be reconfigured are shown in FIGS. 2 and 3. The examples of FIGS. 2 and 3 show the circuit configurations which receive image data as data to be processed and subject the image data to compression encoding. Namely, these examples represent examples when the data processing device according to this exemplary embodiment are applied to compression encoding of the image. Further, as an example of the compression encoding, an explanation will be given of a combination of run-length compression circuits 102*a* and 102*b* and Huffman encoding circuits 110*a* and 110*b*.

Now it is assumed that on the reconfigurable circuit unit 10 having a limited circuit scale, two run-length compression circuits and two Huffman encoding circuits can be configured simultaneously. This exemplary embodiment deals with such a limitation by a scheme of alternately reconfiguring configuration A (FIG. 2), i.e. the first step circuit configuration defined by the configuration data A and configuration B (FIG. 3), i.e. the second step circuit configuration defined by the configuration data B. Each circuit configuration will be explained below.

The configuration A shown in FIG. 2 includes run-length compression circuits 102*a* and 102*b*, counters 104*a* and 104*b*, notifying circuits 106*a* and 106*b* and FIFOs (storage circuits in First-in First-out) 108*a* and 108*b*. The run-length compression circuit 102*a*, counter 104*a*, notifying circuit 106*a* and FIFO 108*a*, as well as the FIFO 108*a*, Huffman encoding unit 110*a* and notifying circuit 112*a* of the circuit configuration in FIG. 3 described later, constitute the first way (named as "a-way") of the two-way processing circuit. The reference symbol indicative of each circuit element constituting the "a-way" is appended with symbol "a" as a suffix. Likewise, the reference symbol indicative of each circuit element constituting the "b-way" is appended with symbol "b" as a suffix.

The run-length compression circuits 102*a* and 102*b* are supplied with different parts of the image data to be processed (the respective parts are referred to as processing units) from the corresponding data input units 12*a* and 12*b*, respectively.

For example, if the image data are document image data containing a plurality of pages, the processing unit of the image data may be a page. In this case, for example, the image data of an odd page is inputted to the a-way, whereas the image data of an even page is inputted to the b-way. As another example, the processing units taken as the first half and second half of the image of a single page may be allotted to the a-way and the b-way, respectively. In this case, in sequence for each page, the image of the first half of the page is inputted to the a-way and concurrently, the image of the second half of the pertinent page is inputted to the b-way. Incidentally, the processing units typically described above are only examples, and other processing units may be adopted. The processing unit to be adopted may be determined according to, for example, the using object of the data processing device according to the exemplary embodiment. Further, with a plurality of processing units being previously made selectable, the user or manager of the image processing device incorporating the pertinent data processing device may select one of them.

The run-length compression circuits 102a and 102b subject the image data of the processing units inputted, respectively to known run-length compression processing in sequence from the lead. The compression resulted data outputted from the run-length compression circuits 102a and 102b are, for example, arranged pairs each consisting of a pixel value (e.g. density (gray scale) value for each color) and the run-length indicative of the number of the pertinent pixel values successive in a scanning direction (It is needless to say that other run-length formats may be adopted).

The compressed data outputted from the run-length compression circuits 102a and 102b are inputted to the FIFOs 108a and 108b, respectively. The FIFOs 108a and 108b store the compressed data inputted in a sequence of first-in and first-out to the limit of data capacity of themselves, respectively. The data capacity of the FIFOs 108a and 108b is, for example, several words or several tens of words. For example, the pair of the pixel value indicative of the run-length information and the run length represents the data of one word (one word is e.g. 2 octets), which are held in the FIFO to the data capacity.

In this exemplary embodiment, the respective data capacities of the FIFOs 108a and 108b are set for substantially equal values. For example, for this purpose, the FIFOs 108a and 108b may be constructed, for example, in such a manner that of a group of circuit elements of the reconfigurable circuit unit 10, the remaining group of circuit elements exclusive of the circuit elements necessary to configure the circuits other than the FIFOs 108a and 108b in the configurations A and B are divided into exact halves. In other words, of the circuits (102a, b to 106a, b) other than the FIFOs 108a and 108b in the configuration A and the circuits (110a, b to 112a,b) other than the FIFOs 108a and 108b in the configuration B, the remaining group of circuit element in the greater number of circuits (PEs) used may be divided into exact halves and allotted to the respective FIFOs. For example, on the basis of such a concept, the data capacities of the FIFOs 108a and 108b may be determined and the FIFOs 108a and 108b consisting of the circuit elements corresponding to the data capacities thus determined may be defined in the configuration A (and B). It should be noted that "division in exact halves" is theoretical and if the number of the remaining circuit elements cannot be divided into exact halves, the data capacities of the FIFOs 108a and 108b may be slightly different.

Now, the FIFOs 108a and 108b may be configured using a single PE (processor element) or a combination of plural PEs within the reconfigurable circuit unit 10. Where the reconfigurable circuit unit 10 includes a group of FIFOs for data input/output for the outside other than the PEs, using the single FIFO or a combination of FIFOs, the FIFOs 108a and 108b may be configured. Further, the PE and FIFO within the reconfigurable circuit unit 10 may be connected to configure the FIFOs 108a and 108b.

The counters 104a and 104b count the numbers of the compressed data inputted from the run-length compression circuits 102a and 102b to the FIFOs 108a and 108b, respectively by for example, reading the signals on the signal lines connecting the run-length compression circuits 102a and 102b to the FIFOs 108a and 108b. This counting counts, for example, the numbers of words (or pairs of the pixel value and run length) outputted from the run-length compression circuits 102a and 102b.

Since mutually different data are inputted to the run-length compression circuits 102a and 102b, the quantities of run-length data of the compression result outputted from the respective circuits 102a and 102b are generally different from each other. For this reason, even if the FIFOs 108a and 108b have equal capacities, generally, either one of them becomes early full (namely, state where the data corresponding to the capacity are input and held in the FIFO). In one example, the notifying circuits 106a and 106b on the respective ways monitor the counted values in the corresponding counters 104a and 104b; if the counted value reaches the data capacity of the FIFO 108a or 108b on the pertinent way, a FIFO-FULL signal indicative of that the corresponding FIFO 108a or 108b has become full may be issued. The reconfiguration control unit 16 receives this signal thereby to trigger reconfiguration of the reconfigurable circuit unit 10.

As another example, the FIFOs (108a and 108b) themselves which have become full of the data may issue the FIFO-FULL signal (Namely, the FIFOs 108a and 108b serve as the circuit including the circuit element which issues the FIFO-FULL signal). In this case, the counters 104a and 104b and the notifying circuits 106a and 106b may not be provided.

Next, referring to FIG. 3, the configuration B will be explained. The configuration B includes FIFOs 108a and 108b, Huffman encoding circuits 110a and 110b and notifying circuits 112a and 112b.

Of these circuits, the FIFOs 108a and 108b are also included in the above configuration A. Namely, even when the reconfigurable circuit unit 10 is reconfigured into the configuration B, the FIFOs 108a and 108b included in the configuration A will be left as they are. In other words, the run-length compression resulted data stored in the respective FIFOs 108a and 108b will be left as they are in the FIFOs 108a and 108b in the reconfigurable circuit unit 10 (configuration B) after reconfiguration.

In the configuration B, the outputs from the FIFOs 108a and 108b are connected to the Huffman encoding circuits 110a and 110b, respectively.

The respective Huffman encoding circuits 110a and 110b encode, by the known Huffman encoding system, the run-length compression resulted data outputted in the first-in first-out order from the corresponding FIFOs 108a and 108b. The encoding resulted data outputted from the Huffman encoding circuits 110a and 110b are outputted through the data output units 14a and 14b and supplied to the host system.

When the notifying circuits 112a and 112b detect the fact that the data supplied from the FIFOs 108a and 108b to the corresponding Huffman encoding units 110a and 110b disappear (i.e. encoding of all the data held in the FIFOs has completed), they notify the reconfiguration control unit 16 of a completion signal indicative of this fact. At the time when the reconfiguration control unit 16 has received the completion signal from both the notifying circuits 112a and 112b (encoding of all the data in the FIFOs in both ways has been completed), the circuit configuration of the reconfigurable circuit unit 10 is restored to the configuration A again.

Next, an explanation will be given of the progress of an exemplary procedure of data processing by the reconfiguration control unit 16 while switching between the configurations A and B illustrated in FIGS. 2 and 3.

When the reconfiguration control unit 16 receives an instruction of starting the processing of the image data from the host system, first, using the configuration data A, it configures the internal circuit of the reconfigurable circuit unit 10 into the configuration A (FIG. 2) which is the first step. The configuration control unit 16 actuates the circuits of the configuration A so that the image data with mutually different processing units are inputted to the run-length compression circuits 102a and 102b through the data input units 12a and 12b on the respective ways. Thus, the image data with each processing unit inputted will be converted into the run-length data from the lead. Further, the run-length data with the corresponding processing units will be stored in the FIFOs 108*a* and 108*b*. Accordingly, when at least one of the FIFOs 108*a* and 108*b* is full, the reconfiguration control unit 16 receives the FIFO-FULL signal from the notifying circuit 106*a* or 106*b* (or FIFO 108*a* or 108*b*).

The reconfiguration control unit 16 which has received the FIFO-FULL signal, according to the configuration data B, reconfigures the internal circuits of the reconfigurable circuit unit 10 into the configuration B (FIG. 3) which is the second step. In the reconfiguration at this time, the part of the FIFOs 108*a* and 108*b* is not changed and the part corresponding to the other circuits is rewritten into the Huffman encoding circuits 110*a* and 110*b* and the notifying circuits 112*a* and 112*b*. In short, the reconfiguration at this time is not the complete reconfiguration of the reconfigurable circuit unit 10, but partial reconfiguration thereof.

Next, the configuration control unit 16 actuates the circuits of the configuration B so that the data held in the FIFOs 108*a* and 108*b* are inputted to the Huffman encoding circuits 110*a* and 110*b*, respectively. Thus, these data are Huffman-encoded and the encoding resulted data are sequentially outputted to the outside (e.g. memory region managed by the host system) through the data output units 14*a* and 14*b* on the respective ways. Further, the both the FIFOs 108*a* and 108*b* becomes vacant (i.e. encoding of all the data in the respective FIFOs is completed), the reconfiguration control unit 16 returns to the first step to reconfigure the internal circuits of the reconfigurable circuit unit 10 into the configuration A. This reconfiguration may be that of the entire reconfigurable circuit unit 10 and may be that of the part other than the FIFOs 108*a* and 108*b*. The reconfiguration control unit 16 actuates the circuits of the reconfigurable circuit unit A again and supplies the data with the next processing units to the respective ways so that the data supplied data are processed.

As described above, the reconfiguration control unit 16 alternately reconfigures the configurations A and B to operate them so that the compression encoding processing of the image data inputted will be advanced.

Next, referring to FIGS. 4 to 7, a modification of the above exemplary embodiment will be explained.

In the exemplary embodiment described above, the data capacities of the FIFOs 108*a* and 108*b* of the respective ways a and b were set for substantially equal values. In contrast, in this modification, the data capacities of the FIFOs 108*a* and 108*b* are appropriately changed according to the rates of the compressed data (output speeds, i.e. quantities per unit time of the compressed data outputted) outputted by the run-length compression circuits 102*a* and 102*b*, respectively. Specifically, in this modification, when the reconfigurable circuit unit 10 reconfigured into the configuration A is operated, the rates of the compressed data outputted from the run-length compression circuits 102*a* and 102*b*, respectively are measured. According to ratio between the rates measured, the data capacities of the FIFOs 108*a* and 108*b* when the reconfigurable circuit unit 10 is reconfigured next time into the configuration A are changed according to that ratio.

For example, as the case may be, because of the difference in the image property between the pages or parts within the page, they differ in the efficiency of the run-length compression. For example, a text part or graphics part is good in the efficiency of the run-length compression, whereas a photographic image part is poor in the efficiency of the run-length compression. Further, of the two ways of a and b, the FIFO in the way of processing the image with the poor compression efficiency is likely to be fuller than that in the other way. For this reason, if the capacities of the FIFOs 108*a* and 108*b* are fixed equally, owing to the influence from the one with poorer compression efficiency of the two ways a and b, the frequency of changing the configuration becomes high. In order to obviates such an inconvenience, in this modification, by increasing the capacity of the FIFO of the way with the poorer compression efficiency as compared with that of the other way, an increase in the frequency of changing the configuration is restrained.

Figure 4:
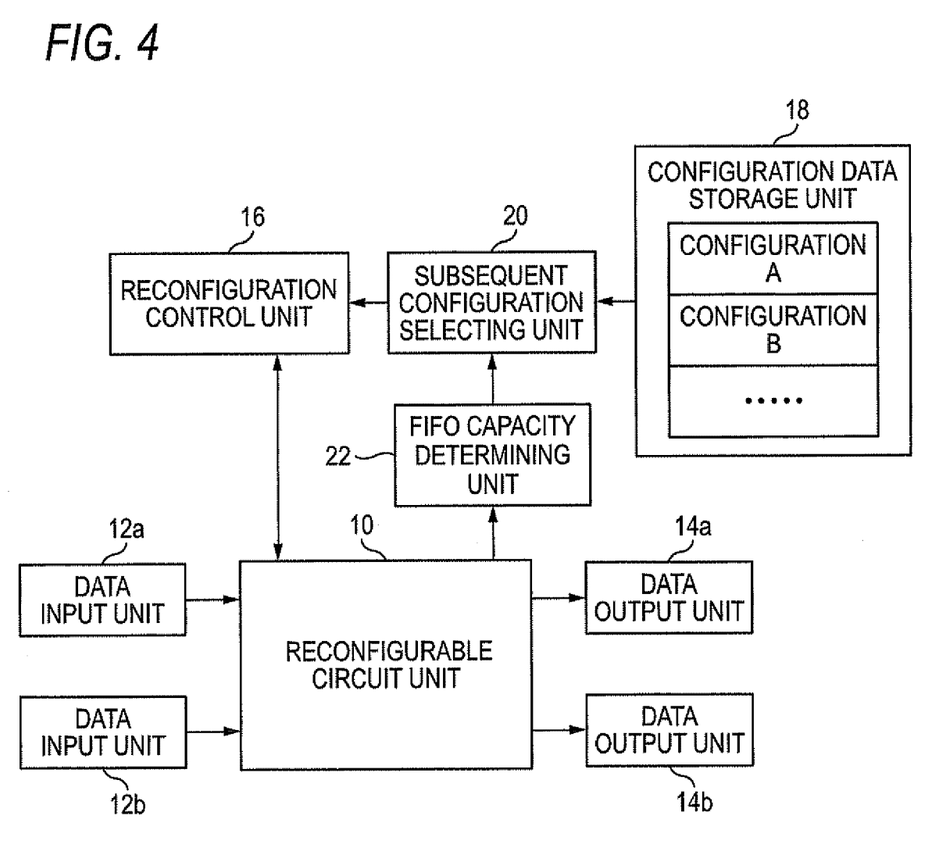
FIG. 4 is a view showing a data processing device according to a modification of the exemplary embodiment.

FIG. 4 is a view showing the construction of the data processing device according to this modification. As seen from the comparison of FIG. 4 with FIG. 1, in this modification, there is newly provided an FIFO determining unit 22 for determining the data capacities of the FIFOs 108*a* and 108*b* when the configurable circuit unit 10 is reconfigured into the configuration A.

In this modification also, the reconfiguration control unit 16 alternately reconfigures the configurations A and B shown in FIGS. 2 and 3, respectively. However, the function of each of the notifying circuit 106*a* and 106*b* in the configuration A is different from that in the above exemplary embodiment.

In this modification, the notifying circuits 106*a* and 106*b*, when at least one of the FIFOs 108*a* and 108*b* is full, notify the reconfiguration control unit 16 of the counted values held by the counters 104*a* and 104*b* at this time.

In one example, when the notifying 106*a* and 106*b* detect that the counted value of the corresponding counter 104*a* and 104*b* becomes the value corresponding to the data capacity of the corresponding FIFO 108*a* or 108*b* (i.e. value indicative of "has become full"), they notify the FIFO capacity determining unit 22 of this fact and the corresponding counted value of the FIFO. In addition, another notifying circuit 106*a* or 106*b* is supplied with a trigger signal to notify the FIFO determining unit 22 of the counted value of the counter 104*a* or 104*b* corresponding (another pertinent notifying circuit) at this time. As another example, the notifying circuits 106*a* and 106*b* may notify in response to, for example, the request from the reconfiguration control unit 16 which has received the FIFO-FULL signal from the FIFO 108*a* or 108*b*. As further another example, the internal circuits within the reconfigurable circuit unit 10 may be configured so that the notifying circuits 106*a* and 106*b* receive the FIFO-FULL signal from the FIFO 108*a* or 108*b*; and according to the FIFO-FULL signal, the notifying circuits 106*a* and 106*b* (even if there is no request from the reconfiguration control unit 16) may notify the FIFO determining unit 22 of the counted values of the corresponding counters 104*a* and 104*b*. The counted values of the respective counters 104*a* and 104*b* at the time when the one of the FIFOs 108*a* and 108*b* has become full correspond to the rates of data output of the run-length compression circuits 102*a* and 102*b* during the period of the pertinent configuration A.

Incidentally, of the FIFOs 108*a* and 108*b*, the counted value relative to the FIFO having become full corresponds to the data capacity of the pertinent FIFO; this value is known for the FIFO capacity determining unit 22 communicatable with the reconfiguration control unit 16 including such a FIFO. So, the counted value relative to the FIFO having become full may not be notified.

The FIFO capacity determining unit 22, on the basis of the information of the counted values notified from the respective notifying circuits 106*a* and 106*b* (regarding the FIFO having become full, the known data capacity of the pertinent FIFO may be adopted instead of the counted value), determines the respective data capacities of the FIFOs 108*a* and 108*b* when the reconfigurable circuit unit 10 is subsequently reconfigured into the configuration A.

Now, of the circuit elements of the reconfigurable circuit unit 10, the total number thereof allotable to the FIFOs 108*a* and 108b is predetermined. This total number corresponds to the total data capacity of the FIFOs 108a and 108b. The FIFO capacity determining unit 22 determines, of the total number (i.e. total number of data capacity), the numbers (data capacities) to be allotted to the FIFOs 108a and 108b, respectively. Roughly, the FIFO capacity determining unit 22 determines the respective data capacities of the FIFOs 108a and 108b so that the ratio between the respective data capacities of the FIFOs 108a and 108b is as close as possible to that between the counted values notified from the corresponding notifying circuits 106a and 106b (or known data capacity of the FIFO).

Figure 5:
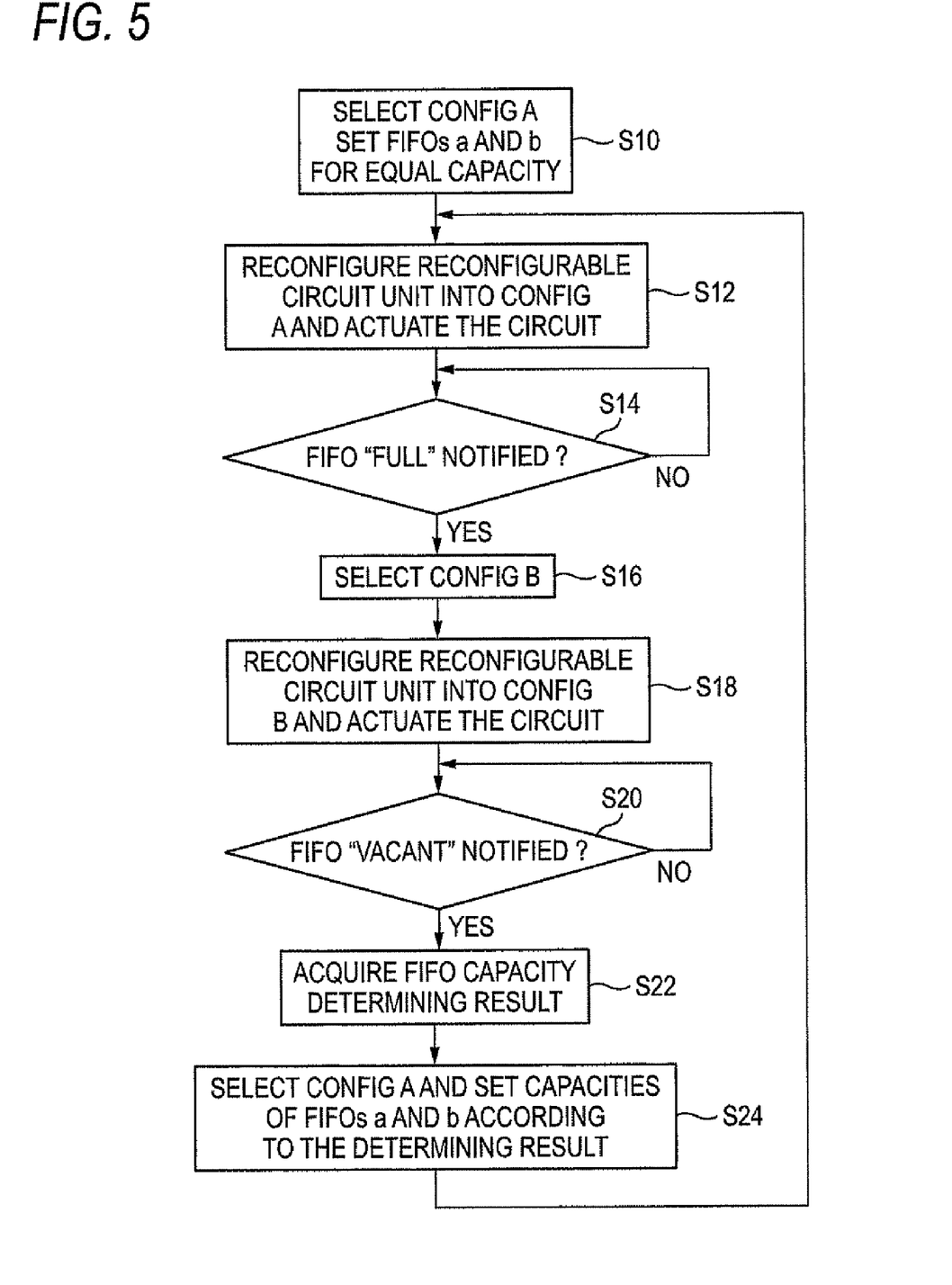
FIG. 5 is a view showing an example of the processing procedure of a reconfiguration control unit in the modification.

Next, referring to FIG. 5, an explanation will be given of an example of the processing procedure of the reconfiguration control unit 16 in this modification.

In this procedure, if the reconfiguration control unit 16 receives an instruction of starting the processing for image data by the host system, it selects the configuration data A to set the FIFOs 108a and 108b for equal capacities (S10). In this case, for example, if the data capacity ratio between the FIFOs 108a and 108b is set, according to this data capacity ratio, the reconfiguration control unit 16 may determine the numbers of circuit components employed for the FIFOs 108a and 108b in the configuration data A. Further, as another example, with the sub-data with different data capacity ratios between the FIFOs 108a and 108b being previously registered in a plural configuration data storage unit 18, the reconfiguration control unit 16 may select one of these sub-data corresponding to the capacity ratio set.

Next, with the FIFOs 108a and 108b set for the equal capacities, the reconfigurable circuit unit 10 is reconfigured according to the configuration data A and the circuit thus reconfigured is actuated (S12). Thus, the image data to be processed are sequentially inputted, for each of processing units, to the run-length compression circuits 102a and 102b in the ways a and b through the data input units 12a and 12b, and compressed there.

Thereafter, the reconfiguration control unit 16 waits for the notification (FIFO-FULL signal) that either one of the FIFOs 108a and 108b has become full (S14). If the reconfiguration control unit 16 receives the notification of "full", it selects the configuration data B as a subsequent configuration (S16). According to this configuration data thus selected, the reconfiguration control unit 16 reconfigures the part other than the FIFOs 108a and 108b of the reconfigurable unit 10. Thus, the configuration shown in FIG. 3 is configured in the reconfigurable circuit unit 10. Thereafter, this configuration is actuated (S18). Thus, he run-length compression resulted data accumulated in the FIFOs 108a and 108b are supplied to the corresponding Huffman encoding circuits 110a and 110b, respectively and processed. Accordingly, the compression encoding resulted data are outputted for each of the corresponding processing units and returned to the host system through the corresponding data output units 14a and 14b.

Incidentally, when it is detected in step S14 that either one of the FIFOs 108a and 108b has become full, on the basis of the counted values of the counters 104a and 104b notified from the notifying circuits 106a and 106b, the FIFO capacity determining unit 22 determines the data capacities (numbers of the circuit elements such as PEs) to be allotted to the FIFOs 108a and 108b in the subsequent configuration A (FIG. 2). This determining result is employed in the later step S22. A concrete example of this determining processing will be described later.

Further, the reconfiguration control unit 16 waits for the notification that the data to be supplied to both the Huffman encoding circuits 110a and 110b have disappeared (namely, both the FOFOs 108a and 108b have become vacant) (S20).

When having received this notification, the reconfiguration control unit 16 acquires from the FIFO capacity determining unit 22 the result of allotting the data capacities to the FIFOs 108a and 108b in the subsequent configuration A previously determined (S22). The reconfiguration control unit 16 selects the configuration data A as the subsequent configuration and also sets the respective data capacities of the FIFOs 108a and 108b according to the allotting result (S24). Thereafter, returning to step S12, under the allotted capacities being set, the FIFOs 108a and 108b are reconfigured according to the configuration data A on the reconfigurable circuit unit 10 and the circuits thus reconfigured are actuated.

Thereafter, the processing steps S12 to S24 will be repeated until the data to be processed supplied from the host system disappear.

Figure 6:
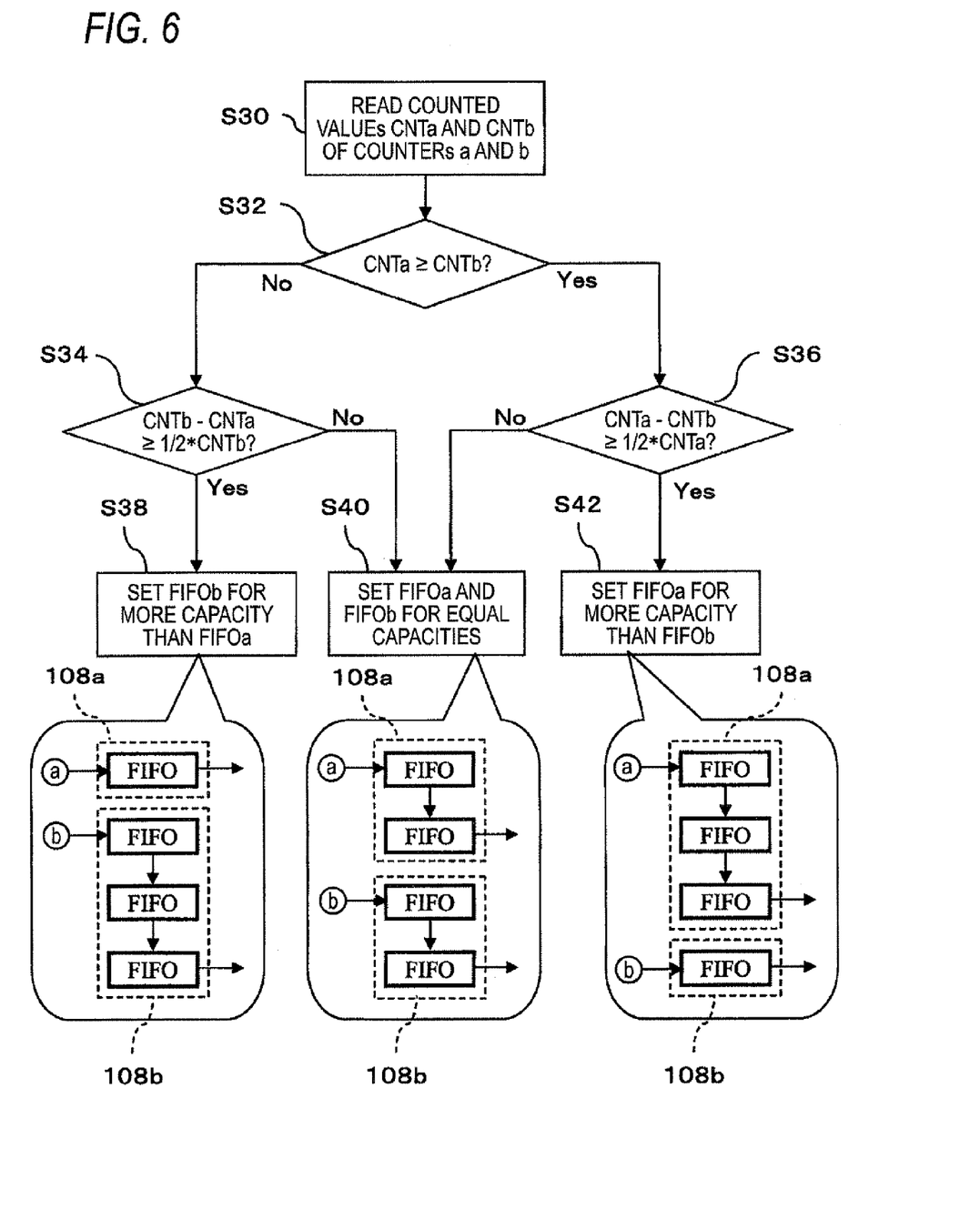
FIG. 6 is a flowchart showing an example of the processing procedure of an FIFO capacity determining unit.

Next, referring to FIG. 6, an explanation will be given of an example of the processing procedure of the FIFO capacity determining unit 22. This example, as seen from the lower part of FIG. 6, is directed to the case where four FIFO elements (illustrated as blocks of "FIFO" in the figure) in total can be ensured within the reconfigurable circuit unit 10. The FIFO element cannot be further divided so that using this element as one unit, these elements will be allotted to the FIFOs 108a and 108b.

In the procedure of FIG. 6, when it is detected in step that either one of the FIFOs 108a and 108b has become full, the FIFO capacity determining unit 22 reads the respective counted values CNTa and CNTb of the a-way (counter 104a) and the b-way (counter 104b) notified from the notifying circuits 106a and 106b, respectively (S30) and compares them with each other (S32). If the counted value CNTb of the b-way is larger than the counted value CNTa of the a-way (i.e. the determining result in S32 is No), the FIFO capacity determining unit 22 determines if or not the following equation holds (834).

$$CNTb - CNTa \geq (1/2) * CNTb$$

This equation holds in the case where the counted value in the b-way is twice or more as large as that in the a-way. In this case (i.e. if the determining result in step S34 is Yes), the FIFO capacity determining unit 22 determines that the capacity of the FIFO 108b is larger than that of the FIFO 108a; namely, of the four FIFO elements, three is allotted to the former and one is allotted to the latter (S38). Incidentally, in this case, the FIFO 108b is configured by linking the three elements in such a form of connecting the output from a certain FIFO element to the input to another FIFO element.

If the determining result in step S34 is No, the counted value in the b-way is smaller than twice, or once or more as large as the counted value in the a-way. In this case, the FIFO capacity determining unit 22 determines that the capacities of the FIFOs 108b and 108a are equivalent, i.e. of the four FIFO elements, two are allotted to the former and the latter, respectively (S40).

Further, if the determining result in step S32 is Yes, the FIFO capacity determining unit 22 further determines if or not the following equation holds (S36).

$$CNTa - CNTb \geq (1/2) * CNTa$$

This equation holds in the case where the counted value in the a-way is twice or more as large as that in the b-way. In this case (i.e. if the determining result in step S36 is Yes), the FIFO capacity determining unit 22 determines that the capacity of the FIFO 108a is larger than that of the FIFO 108b; namely, of the four FIFO elements, three is allotted to the former and one is allotted to the latter (S42).

Where the determining result in step S36 is No, the counted value in the a-way is smaller than twice, or once or more as large as the counted value in the b-way. In this case, the FIFO capacity determining unit 22 determines that the capacities of the FIFOs 108*b* and 108*a* are equivalent, i.e. of the four FIFO elements, two are allotted to the former and the latter, respectively (S40).

As described above, in the example of FIG. 6, the FIFO elements of four units are distributed to the FIFOs 108*a* and 108*b* at a ratio nearer to the ratio between the counted values of the a-way and the b-way (i.e. ratio between the rates of generating the run-length compression data). It should be noted that the corresponding relationship between the ratio of the counted values and that of the FIFO elements illustrated in FIG. 6 is only an example.

Figure 7:
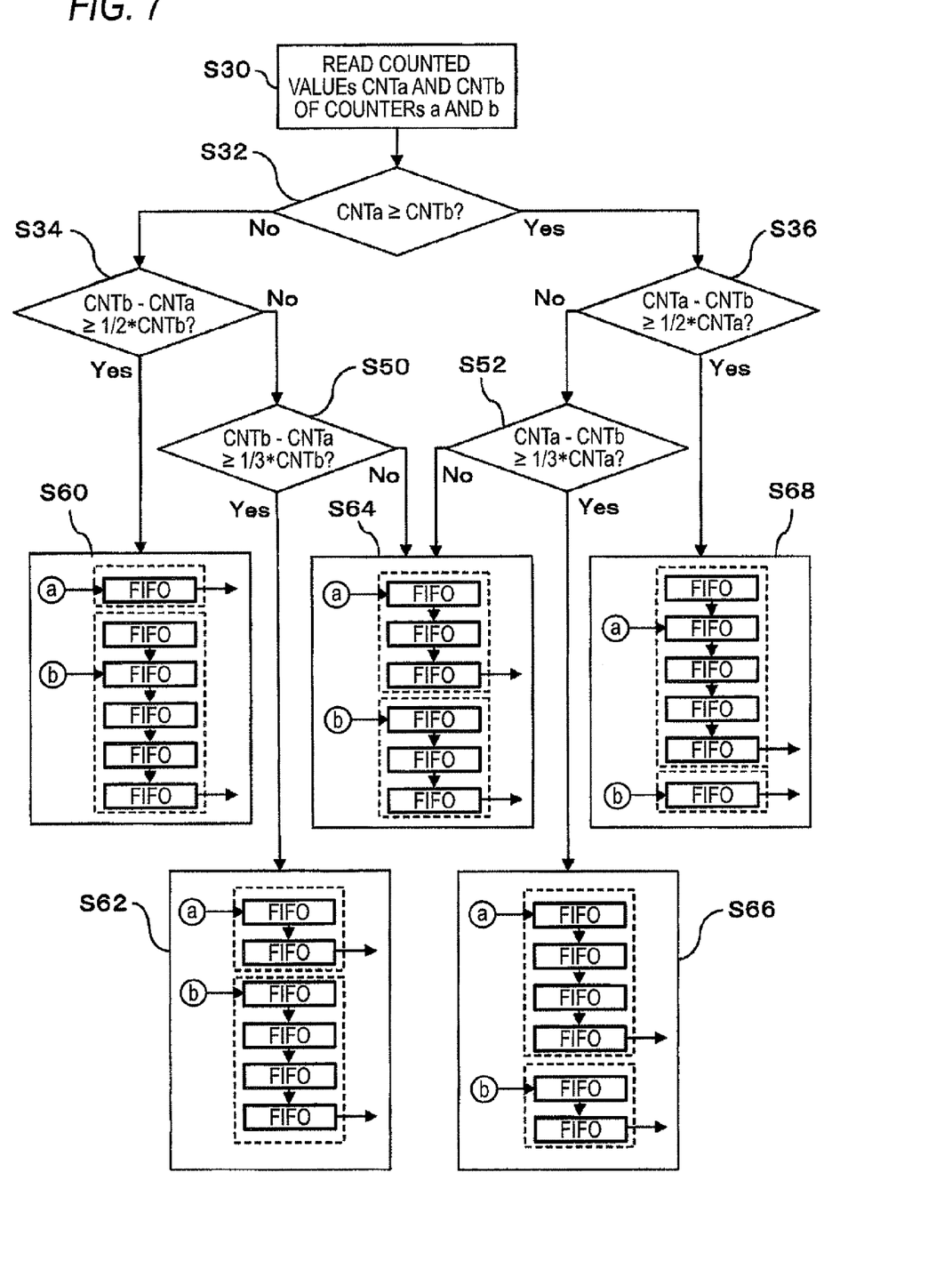
FIG. 7 is a flowchart showing another example of the processing procedure of an FIFO capacity determining unit.

Next, the example shown in FIG. 7 is directed to the case where six FIFO elements can be ensured within the reconfigurable circuit unit 10. In FIG. 7, the steps of executing the same processing as in FIG. 6, referring to like reference symbols, will not be explained in detail.

In this example, if the determining result in step S34 is Yes, the FIFO capacity determining unit 22 determines that of the six FIFO elements, five is allotted to the former and one is allotted to the latter (S60).

On the other hand, if the determining result in step S34 is No, the FIFO capacity determining unit 22 further determines if or not the following equation holds (S50).

$$CNTb - CNTa \geq (1/3)*CNTb$$

This equation holds in the case where the counted value in the b-way is 3/2 times or more and smaller than twice as large as that in the a-way. In this case (i.e. if the determining result in step S50 is Yes), the FIFO capacity determining unit 22 determines that of the six FIFO elements, four are allotted to the FIFO 108*b* and two are allotted to the FIFO 108*a* (S62).

Where the determining result in step S50 is No, the counted value in the b-way is once or more and smaller than 3/2 times as large as the counted value in the a-way. In this case, the FIFO capacity determining unit 22 determines that the capacities of the FIFOs 108*b* and 108*a* are equivalent; i.e. of the six FIFO elements, three are allotted to the former and the latter, respectively (S64).

Where the determining result in step S36 is Yes, the counted value in the a-way is twice or more as large as the counted value in the b-way. In this case, the FIFO capacity determining unit 22 determines that five are allotted to the FIFO 108*a* and one is allotted to the FIFO 108*b* (S68).

On the other hand, if the determining result in step S36 is No, the FIFO capacity determining unit 22 further determines if or not the following equation holds (S52).

$$CNTa - CNTb \geq (1/3)*CNTa$$

This equation holds in the case where the counted value in the a-way is 3/2 times or more and smaller than twice as large as that in the b-way. In this case, the FIFO capacity determining unit 22 determines that of the six FIFO elements, four are allotted to the FIFO 108*a* and two are allotted to the FIFO 108*b* (S66).

Where the determining result in step S52 is No, the counted value in the a-way is once or more and smaller than 3/2 times as large as the counted value in the b-way. In this case, the FIFO capacity determining unit 22 determines that the capacities of the FIFOs 108*b* and 108*a* are equivalent; i.e. of the six FIFO elements, three are allotted to the former and the latter, respectively (S64).

As described above, in the example of FIG. 7, the FIFO elements of six units are distributed to the FIFOs 108*a* and 108*b* at a ratio nearer to the ratio between the counted values of the a-way and the b-way (i.e. ratio between the rates of generating the run-length compression data). It should be noted that the corresponding relationship between the ratio of the counted values and that of the FIFO elements illustrated in FIG. 7 is only an example.

In the examples described above, through the comparison processing in S32 to S36 and S50 to S52, the capacities to be allotted to the FIFOs 108*a* and 108*b* are determined, but these examples are exemplary. Instead of this, for example, for each of the ranges of the ratio of the counted values between the a-way and the b-way, the information of the corresponding relationship which represents the capacity ratio between the FIFOs 108*a* and 108*b* (e.g. ratio of the numbers of the FIFO elements allotted to them) corresponding to the pertinent range may be previously stored in the storage device within the data processing device. In this case, the FIFO determining unit 22, referring to the information on the corresponding relationship, determines the capacitor ratio between the FIFOs 108*a* and 108*b*.

Further, in the examples of FIGS. 6 and 7, the number of the FIFO elements which can be ensured within the reconfigurable circuit unit 10 was even, but also in the case where the number is odd, it can be seen that by only changing the corresponding relationship between the ratio of the counted values and the number of the FIFO elements, this case can be handled in the same manner.

Figure 8:
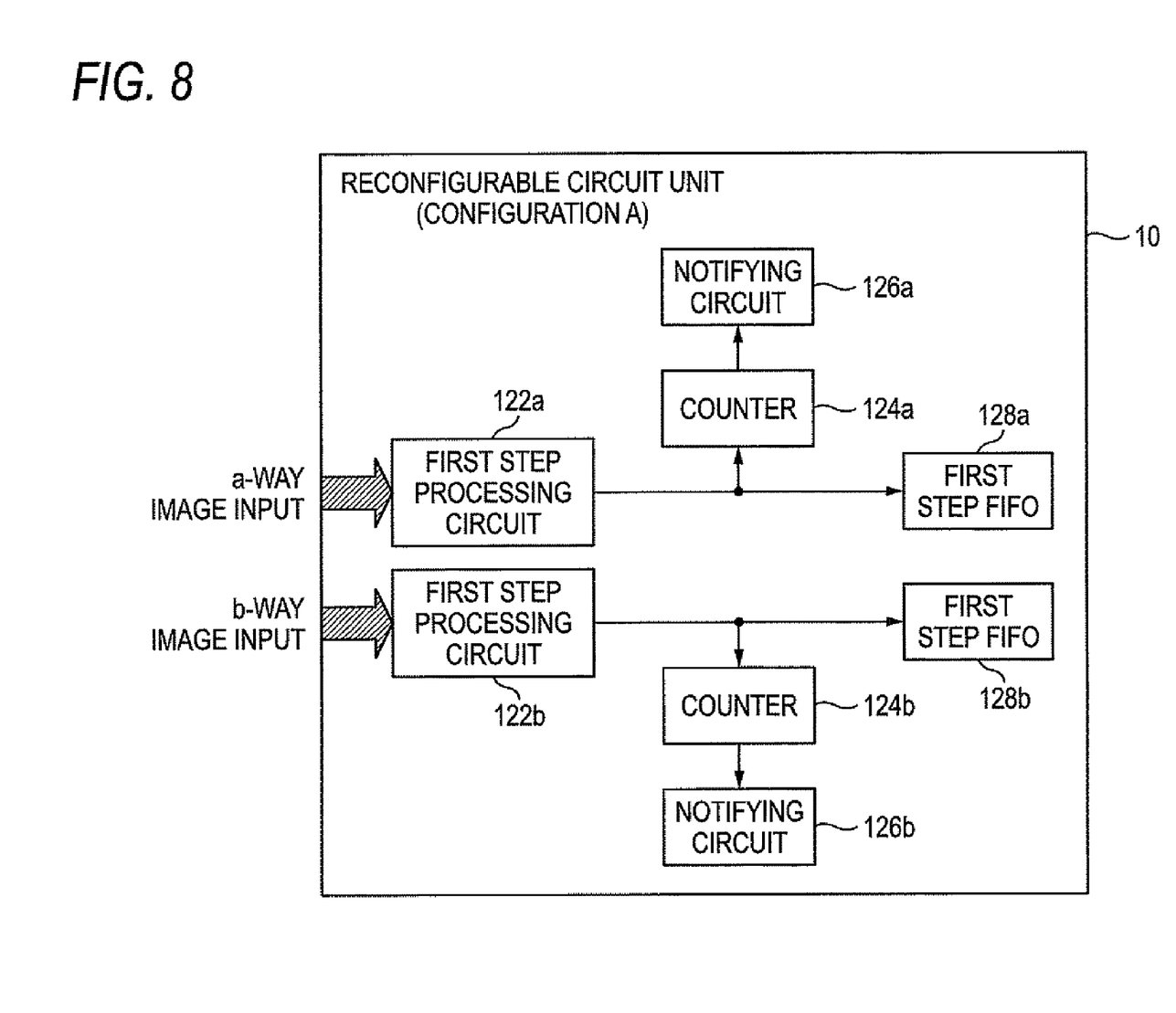
FIG. 8 is a view schematically showing the first configuration A according to a second modification of the exemplary embodiment.
Figure 9:
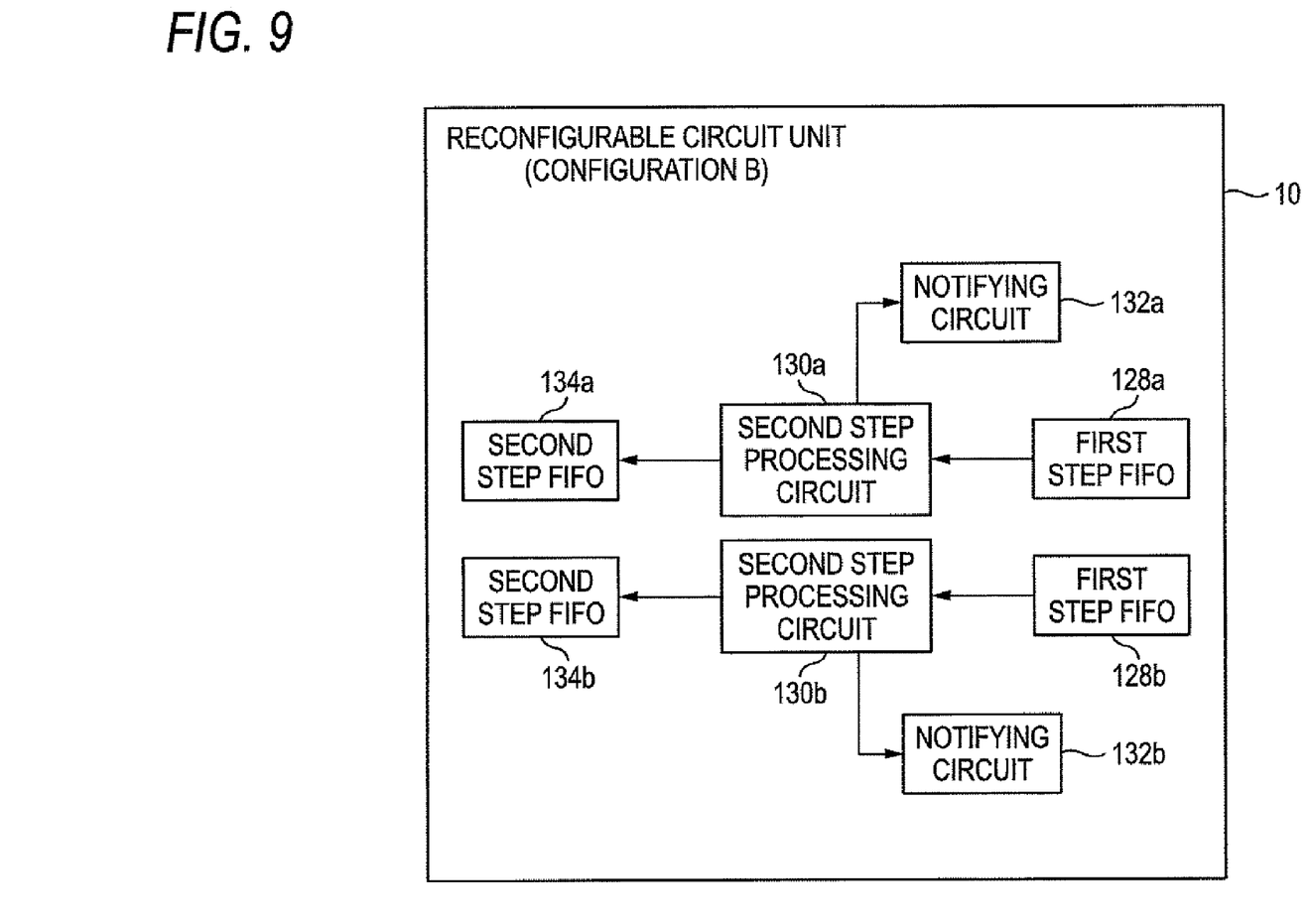
FIG. 9 is a view schematically showing the second configuration B according to the second modification of the exemplary embodiment.
Figure 10:
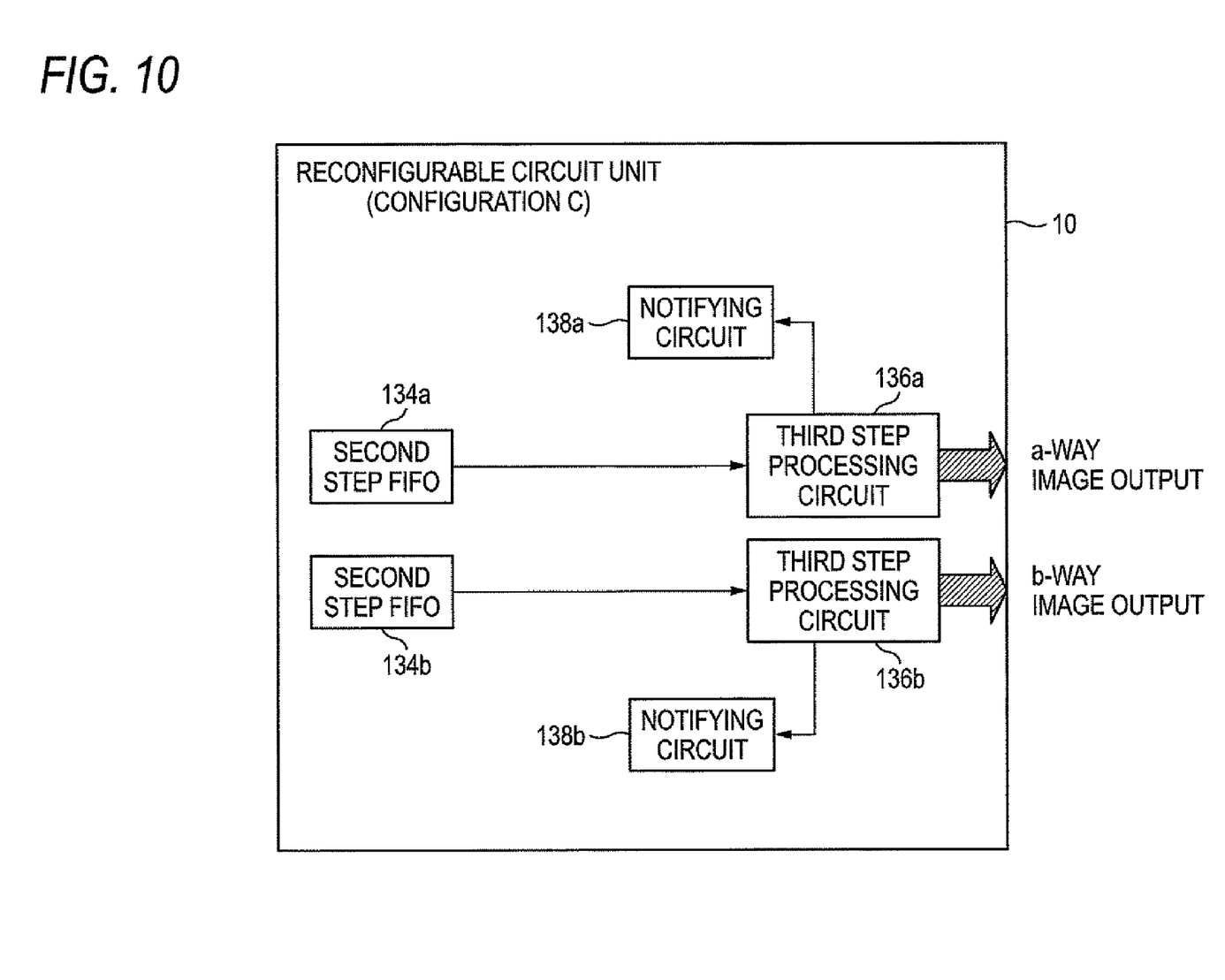
FIG. 10 is a view schematically showing the third configuration C according to the second modification of the exemplary embodiment.

Referring to FIGS. 8 to 10, an explanation will be given of the second modification of the data processing device. In the exemplary embodiment and modification described referring to FIGS. 1 to 7, the two configurations A and B were reconfigured alternately, whereas in the second modification, three configurations A, B and C (shown in FIGS. 8, 9 and 10) will be reconfigured circulatedly and repeatedly in this order.

The entire construction of the data processing device according to this second modification may be the same as that adopted in the above exemplary embodiment and modification (see FIGS. 1 and 4). This modification is different from the exemplary embodiment and modification in each of the configurations A, B and C reconfigured in the reconfigurable circuit unit 10 and the control contents of the reconfiguration control unit 16 which controls their reconfiguration.

In this modification, the data processing device first processes the input data to be processed by the first step processing circuits (122*a* and 122*b*: see FIG. 8); subsequently processes the processing result by the second step processing circuits (130*a* and 130*b*: see FIG. 9) and further processes the processing result by the third step processing circuits (134*a* and 134*b*: see FIG. 10), thereby acquiring the final processing result.

Now it is assumed that in the reconfigurable circuit unit 10, because of the limitation of a circuit scale, the two first step processing circuits 122*a*, 122*b* and two second processing circuits 130*a*, 130*b*, necessary for parallel processing cannot be reconfigured simultaneously; and the two second step processing circuits 130*a*, 130*b* and the two third step processing circuits 134*a*, 134*b* cannot be also reconfigured simultaneously.

In order to overcome such a limitation, the FIFOs configured within the reconfigurable circuit unit 10 will be used. The configuration A shown in FIG. 8, which has the same configuration as the configuration A illustrated in FIG. 2, includes the first step processing circuits 122*a*, 122*b*; counters 124*a*, 124*b*; notifying circuits 126*a*, 126*b* and first step FIFOs 128*a*, 128*b*.

The first step processing circuits 122*a* and 122*b* serve to receive the data from the data input unit 12*a* and 12*b* and execute predetermined first step processing for the data thus received. The outputs of the first step processing circuits 122a, 122b are connected to the corresponding first step FIFOs 128a, 128b and to the corresponding counters 124a, 124b, respectively. The first step FIFOs 128a, 128b store the processing resulted data outputted from the first step processing circuits 122a, 122b and output the data in a first-in first-out system. The output of each counter 124a, 124b is connected to the corresponding notifying circuit 126a, 126b.

The counters 124a, 124b, notifying circuits 126a, 126b and first step FIFOs 128a, 128b in the configuration A of FIG. 8 execute the same processing as that of the counters 104a, 104b, notifying circuits 106a, 106h and FIFOs 108a, 108b in the example of FIG. 1 or 4.

The configuration B shown in FIG. 9 includes the first step FIFOs 128a and 128b; second step processing circuits 130a and 130h and notifying circuits 132a and 132h, as in the configuration B illustrated in FIG. 3, and also includes the second step FIFOs 134a and 134b.

The second step processing circuits 130a and 130b receive the data from the corresponding first step FIFOs 128a and 128b and execute predetermined second step processing for the data thus received. The processing results of the second step processing circuits 130a and 130b are accumulated in the second step FIFOs 134a and 134b, respectively. The notifying circuits 132a and 132b, like the notifying circuits 112a and 112b in the example of FIG. 3, when the data to be supplied to the corresponding second step processing circuit 130a or 130b disappear, notify the reconfiguration control unit 16 of this fact.

The configuration C shown in FIG. 10 is similar to the configuration B shown in FIG. 3. The configuration C includes the second step FIFOs 134a and 134b, third step processing circuits 136a and 136b and notifying circuits 138a and 138b.

The third step processing circuits 136a and 136b receive the data from the corresponding the second step FIFOs 134a and 134h, respectively, and execute predetermined third step processing for the data thus received. The processing results from the third step processing circuits 136a and 136b are outputted to the host system through the corresponding data output unit 14a or 14b. The notifying circuits 138a and 138b, like the notifying circuits 112a and 112b in the example of FIG. 3, when the data to be supplied to the corresponding third step processing circuit 136a or 136b disappear, notify the reconfiguration control unit 16 of this fact.

In this second modification, in the configuration B, two kinds of FIFOs, i.e. first step FIFOs 128a and 128b and second step FIFOs 134a and 134b are configured. For this reason, the capacities of the first step FIFOs 128a and 128b are previously determined considering the capacities to be allotted to the second step FIFOs 134a and 134b.

When the reconfiguration control unit 16 receives an instruction of starting the processing of the image data from the host system, first, using the configuration data A, it configures the internal circuits of the reconfigurable circuit unit 10 into the configuration A and supplies the input data of the corresponding processing units to the data input units 12a and 12b. Thus, these input data are processed by the first step processing circuits 122a and 122b and the processing results are accumulated in the first step FIFOs 128a and 128b.

When at least one of the first step FIFOs 128a and 128b is full, the reconfiguration control unit 16 partially reconfigures the reconfigurable circuit unit 10 in the part other than the first step FIFO 128a and 128b, thereby configuring the circuits of the configuration B. The reconfiguration control unit 16 supplies the data in the first step FIFOs 128a and 128b to the second step processing circuits 130a and 130b so that the data thus supplied are processed. The processing results of the second step processing circuits 130a and 130b are accumulated in the second step FIFOs 134a and 134b, respectively.

After the processing proceeds, when it is known by the notification from the notifying circuits 132a and 132b that both the first step FIFOs 128a and 128b have become vacant, the reconfiguration control unit 16 partially reconfigures the reconfigurable circuit unit 10 in its part other than the second step FIFOs 134a and 134b, thereby configuring the circuits of the configuration C. Further, the reconfiguration control unit 16 supplies the data in the second step FIFOs 134a and 134b to the third step processing circuits 136a and 136b so that the data thus supplied are processed. The processing results from the third step processing circuits 136a and 136b are outputted to the host system through the corresponding data output unit 14a or 14b.

Further, after the processing proceeds, when it is known by the notification from the notifying circuits 138a and 138b that both the second step FIFOs 134a and 134b, have become vacant, the reconfiguration control unit 16 reconfigures the reconfigurable circuit unit 10 into the configuration A so that the next input data supplied from the host system will be processed. The following processing has been explained above.

The control described hitherto will be repeated until the input data supplied from the host system disappear.

In this second modification also, as in the modification shown in FIGS. 4 to 7, according to the ratio between the data output rates of the first step processing circuits 122a and 122b during the period while the circuit of the configuration A was operated (i.e. the ratio between the counted values in the counters 124a and 124b), the respective data capacities of the first step FIFOs 128a and 128b when the configuration A is reconfigured next time may be adjusted. Further, in accordance with such adjustment of the data capacities of the first step FIFOs 128a and 128b, the data capacities of the second step FIFOs 134a and 134b in the subsequent configuration 13 may be adjusted.

FIGS. 8 to 10 showed the example of circulatedly repeating three steps of configurations. However, under the same idea, the device of repeating four or more steps of configurations may be constructed.

If generalized, in the data processing device which circulatedly repeats the n (n: an integer of 3 or greater) steps of configurations, the configurations of the first step and n-th step (final step) are the same as the configuration A of FIG. 8 and the configuration C of FIG. 10, respectively. The configuration of each the steps (k-th steps) of k=2 to (n−1) which are intermediate between both steps, while leaving two (k−1)-th step FIFOs holding the processing result of the (k−1)-th step, may include two k-th step processing circuits and two k-th step FIFOs accumulating the processing results in these two processing circuits. Further, when the data processing in the k-step configuration is completed, i.e. both of two (k−2)-th step FIFOs with in this configuration have become vacant, the reconfiguration control unit 16, while leaving the two k-th step FIFOs holding the processing results of this step, reconfigures the reconfigurable circuit unit 10 into a (k+1)-th step configuration. Upon completion of the processing in the n-th step configuration, the reconfigurable circuit unit 10 is restored to the first step configuration.

All the examples described hitherto are directed to the parallel processing of two ways, but this invention can be easily expanded to a system for executing the parallel processing of three or more ways.

The data processing device using the circuit configurations described above can be applied to an image processing device such as a printer system, a scanner system, a digital copier, a facsimile and a digital composite machine (device having all the functions of a printer, a scanner and a copier. As the case may be, this device further includes a facsimile function and an electric mail transmit/receive function).

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A data processing device comprising:
a reconfigurable circuit capable of being dynamically reconfigured in circuit configuration;
a control unit that controls the reconfigurable circuit, wherein the control unit repeatedly executes
  a first reconfiguration control of reconfiguring, on the reconfigurable circuit, a plurality of first processing circuits and a plurality of first holding circuits corresponding to the plurality of first processing circuits, respectively,
  a first processing control of repeating processing of inputting mutually different input data to the respective plurality of first processing circuits reconfigured on the reconfigurable circuit by the first reconfiguration control so that the data inputted are processed in parallel therein and of inputting processing result data outputted from the plurality of first processing circuits, respectively to the corresponding first holding circuits so that the data inputted are held therein, until a quantity of the processing result data inputted to any one of the plurality of first holding circuits reaches an upper limit of the pertinent first holding circuit,
  a second reconfiguration control of reconfiguring a plurality of second processing circuits on the reconfigurable circuit in place of the plurality of first processing circuits while leaving the plurality of first holding circuits even after the first processing control, and
  a second processing control of inputting, to the respective second processing circuits reconfigured on the reconfigurable circuit by the second reconfiguration control, processing result data held in the corresponding first holding circuits so that the data inputted are processed in parallel therein and if all the processing result data held in the plurality of first holding circuits have been processed by the plurality of second processing circuits, returning to the first reconfiguration control again; and
a capacity allotting unit that allots, on the basis of the quantity of the processing result data inputted to the plurality of first holding circuits by the first processing control, respectively, the respective capacities of the plurality of first holding circuits in the first reconfiguration control to be executed subsequently to the second processing control after the first processing control, wherein the capacity allotting unit allots a more capacity for the first holding circuit inputted with a larger quantity of the processing result data inputted in the first processing control, and
the control unit reconfigures the first holding circuits having the capacities allotted by the capacity allotting unit as the respective plurality of first holding circuits in the first reconfiguration control after the second processing control.

2. A data processing device comprising:
a reconfigurable circuit capable of being dynamically reconfigured in circuit configuration;
a control unit that controls the reconfigurable circuit, wherein the control unit repeatedly executes
  a first reconfiguration control of reconfiguring, on the reconfigurable circuit, a plurality of first processing circuits and a plurality of first holding circuits corresponding to the plurality of first processing circuits, respectively,
  a first processing control of repeating the processing of inputting mutually different input data to the respective plurality of first processing circuits reconfigured on the reconfigurable circuit by the first reconfiguration control so that the data inputted are processed in parallel therein and of inputting processing result data outputted from the plurality of first processing circuits, respectively to the corresponding first holding circuits so that the data inputted are held therein, until a quantity of the processing result data inputted to any one of the plurality of first holding circuits reaches the upper limit of the pertinent first holding circuit,
  an intermediate control of repeatedly executing in sequence for each k of k=2 to (n−1) (n: an integer of 3 or greater)
    a k-th reconfiguration control of reconfiguring a plurality of k-th processing circuits and a plurality of k-th holding circuits corresponding to the plurality of k-th processing circuits, respectively, on the reconfigurable circuit in place of the plurality of (k−1)-th processing circuits while leaving the plurality of (k−1)-th holding circuits after the (k−1)-th processing control, and
    a k-th processing control of inputting, to the respective k-th processing circuits reconfigured on the reconfigurable circuit by the k-th reconfiguration control, the processing result data held in the corresponding (k−1)-th holding circuits so that the data inputted are processed in parallel therein, of inputting processing result data outputted from the plurality of k-th processing circuits, respectively to the corresponding k-th holding circuits so that the data inputted are held therein, and if all the processing result data held in the plurality of (k−1)-th holding circuits have been processed by the plurality of k-th processing circuits, proceeding to a (k+1)-th reconfiguration control,
  a n-th reconfiguration control of reconfiguring a plurality of n-th processing circuits on the reconfigurable circuit in place of the plurality of (n−1)-th processing circuits while leaving the plurality of (n−1)-th holding circuits after the (n−1)-th processing control, and
  a n-th processing control of inputting, to the respective n-th processing circuits reconfigured on the reconfigurable circuit by the n-th reconfiguration control, the processing resulted data held in the corresponding (n−1)-th holding circuits so that the data inputted are processed in parallel therein and if all the processing result data held in the plurality of (n−1)-th holding circuits have been processed by the plurality of n-th processing circuits, returning to the first reconfiguration control again; and a capacity allotting unit that allots, on the basis of the quantity of the processing result data inputted to the plurality of first holding circuits by the first processing control, respectively, the respective capacities of the plurality of first holding circuits in the first reconfiguration control to be executed subsequently to one of the k-th processing control and the n-th processing control after the first processing control, wherein the capacity allotting unit allots a more capacity for the first holding circuit inputted with a larger quantity of the processing result data inputted in the first processing control, and the control unit reconfigures the first holding circuits having the capacities allotted by the capacity allotting unit as the respective plurality of first holding circuits in the first reconfiguration control after the one of the k-th processing control and the n-th processing control.

3. The data processing device of claim 1, wherein the mutually different input data is different portions of a single document image data.

4. The data processing device of claim 2, wherein the mutually different input data is different portions of a single document image data.

5. The data processing device of claim 1, wherein
the plurality of first processing circuits are configured as a run-length compression circuit, and
the plurality of second processing circuits are configured as a Huffman encoding circuit.

6. The data processing device of claim 2, wherein
the plurality of first processing circuits are configured as a run-length compression circuit, and
one of the plurality of k-th processing circuits are configured as a Huffman encoding circuit.

7. The data processing device of claim 2, wherein
the plurality of first processing circuits are configured as a run-length compression circuit, and
one of the plurality of n-th processing circuits are configured as a Huffman encoding circuit.

* * * * *